United States Patent [19]

Hargrave et al.

[11] Patent Number: 4,782,480
[45] Date of Patent: Nov. 1, 1988

[54] TELEPHONE LINE ACCESS APPARATUS

[75] Inventors: Franklin Hargrave; Francisco A. Middleton, both of Newton; David A. Zeller, Jr., Brookfield, all of Conn.

[73] Assignee: Alcatel USA, Corp., New York, N.Y.

[21] Appl. No.: 799,522

[22] Filed: Nov. 19, 1985

[51] Int. Cl.$^4$ ............................................. H04J 1/14
[52] U.S. Cl. ...................................... 370/76; 379/332
[58] Field of Search ............................ 370/30, 58, 76; 179/2 C, 98, 175.2 R, 175.2 C, 175.3 R, 2 DP; 340/310 CP; 333/194, 219, 175, 176; 361/119, 120

[56] References Cited

U.S. PATENT DOCUMENTS

| 2,009,438 | 7/1935 | Dudley | 370/30 |
| 3,562,792 | 6/1968 | Berlincourt et al. | 333/187 |
| 4,161,008 | 7/1979 | Zimmermann et al. | 361/119 |
| 4,215,325 | 7/1980 | Sansone | 333/176 |
| 4,342,969 | 8/1982 | Myers et al. | 333/219 |
| 4,353,043 | 10/1982 | Gunton | 333/194 |
| 4,388,718 | 6/1983 | Gerke et al. | 179/2 DP |
| 4,440,980 | 3/1984 | Bakker | 179/81 R |
| 4,575,699 | 3/1986 | Lockwood | 333/219 |
| 4,575,840 | 3/1986 | Hargrave et al. | 179/98 |

FOREIGN PATENT DOCUMENTS 3237652 4/1984 Fed. Rep. of Germany ...... 379/331

Primary Examiner—Benedict V. Safourek
Assistant Examiner—Stephen Chin
Attorney, Agent, or Firm—Peter C. Van Der Sluys

[57] ABSTRACT

A telephone line access apparatus includes a first stage for providing high voltage protection and a second stage filter in series with the first stage. The first and second stages are incorporated within a housing that is adapted to plug into an existing main distribution frame of a telephone central office.

14 Claims, 3 Drawing Sheets

TELEPHONE LINE ACCESS APPARATUS

BACKGROUND OF THE INVENTION

The present invention generally relates to a telephone line access apparatus and, in particular, relates to one such line access apparatus including a first stage high voltage protection means, a second stage filter means, and means for housing the first and second stages, the housing means being adapted to plug into a main distribution frame.

In general, the public telephone systems implemented throughout the world include a plurality of subscriber pairs of wires each being fed at one end thereof, into a main distribution frame. From the main distribution frame the subscriber pairs are connected to the telephone company switching equipment. The switching equipment is connected to networking equipment, such as, for example, long line cables, microwave links and the like. The switching equipment performs the services of interconnecting pairs of subscriber wires and the networking equipment establishes telephonic voice communication between different switches to establish connection between different ones of the subscriber pairs. Typically, in order to standardize and enhance network wide equipment utilization, all of the elements of the telephone system have been limited to carrying only a relatively small voice band of frequencies regardless of the actual bandwidth capability of the individual elements. Usually, the band limitation imposed ranges from DC to about 4,000 Hertz. This particular limitation has traditionally been imposed primarily due to the bandwidth capability of the various switch and networking equipment, rather than the capability of the subscriber pairs of wires on the subscriber side of the main distribution frames. As it happens, however, the subscriber pairs of wires are usually copper and, in a vast majority of installations, are quite capable of supporting a much larger bandwidth than the limited allowable bandwidth. Specifically, as part of standardization the subscriber pairs of wires have been limited to carrying signals below 4 kiloHertz. One reason for extending the frequency limitations to all elements of such systems is that, in many instances, a higher frequency signal, if injected onto a subscriber pair, would be disruptive if transmitted through the switch to the networking, or transmission, equipment.

As a result of the relatively recent advances in the transmission and use of digitized information, the subscriber pairs of wires of telephone companies have become the object of interest for communicating many different types of information with a consumer. One major reason for this interest is that such communication paths exist and connect to an extremely large percentage of the populus. The use of such existing wiring would clearly result in massive savings in introducing new services since new and redundant wiring of such a large potential market would be avoided. To date, in order to overcome the bandwidth limitations imposed by the transmission equipment and exploit the available bandwidth of subscriber pairs, equipment manufacturers and system developers have made use of filters that are installed in series between each subscriber pair of wires and the central office switching equipment in order to comply with the signal levels at frequencies above the voice band. Nevertheless, the actual installation and implementation of such digital signal equipment and systems has been severely limited primarily due to the expense involved in rewiring existing main distribution frames in order to install the necessary filters. Consequently, individual and isolated applications, particularly, in the public switching environment are developed or implemented due to the tremendous overhead cost of the administration and installation of such filters. That is, only those services that can justify the cost associated with the filter installation and the costs associated with rewiring a main distribution frame have beem implemented. Further, even when such an application, and the demand therefor, may justify the exorbitant cost for the filters, the actual installation quite frequently becomes extremely difficult because of the crowding of current main distribution frames and the wiring associated therewith.

In any event, the requirements imposed upon such filters with respect to the signals that must be allowed to pass without attenuation, for example, the DC current feed and ring voltages used in voice communications, often make the implementation of the filters large and prohibitively expensive. Because of the relatively large size of the passive series filtering elements they are usually remotely located from the main distribution frame. Therefore, currently, because of remote location and the series nature of the connection of such filters, the main distribution frame nearest the location of the filter has to be rewired with additional pairs of wires. That is, one pair of wires must be provided for connecting to the outside filter from the subscriber pair and another pair of wires must be provided from the filter location back to the main distribution frame for continuing the subscriber pair from the filter to the central office switching equipment. This is sometimes extremely difficult because a large number of main distribution frames are currently operating at greater than 50% capacity.

Nevertheless, passive filter configurations that are capable of passing DC currents and inserted in series with the telephone line for low bandpass and bandstop filtering are known.

Alternatively, active filters that are relatively small are available using modern semiconductor technology. However, the application of these small active filters to subscriber pairs is generally not feasible due to the high feed and ring voltages normally present on telephone lines. Further, such active filters are extremely susceptable to catastrophic failure due to high voltage transients created by high voltage inductions and lightning strikes.

Consequently, a relatively small passive filter apparatus that can be implemented without the presently required rewiring of the main distribution frame is necessary to fully realize the implementation, development and provision of additional services to a customer premise via an auxiliary service provider. Such an apparatus would inherently be comparatively inexpensive and convenient from the telephone administration point of view.

SUMMARY OF THE INVENTION

Accordingly, it is one object of the present invention to provide a telephone line access apparatus that is relatively small, inexpensive, and provides the necessary filtering of signals reaching the central office switch.

This object is accomplished, at least in part, by a telephone line access apparatus including, a first stage high voltage protection means, a second stage filtering means and a means for housing the filter stage and high voltage protection stage, the means being adapted to be plugged into a main distribution frame.

Other objects and advantages will become apparent to those skilled in the art from the following detailed description read in conjunction with the appended claims and the drawings attached hereto.

DETAILED DESCRIPTION OF THE INVENTION

Figure 1:
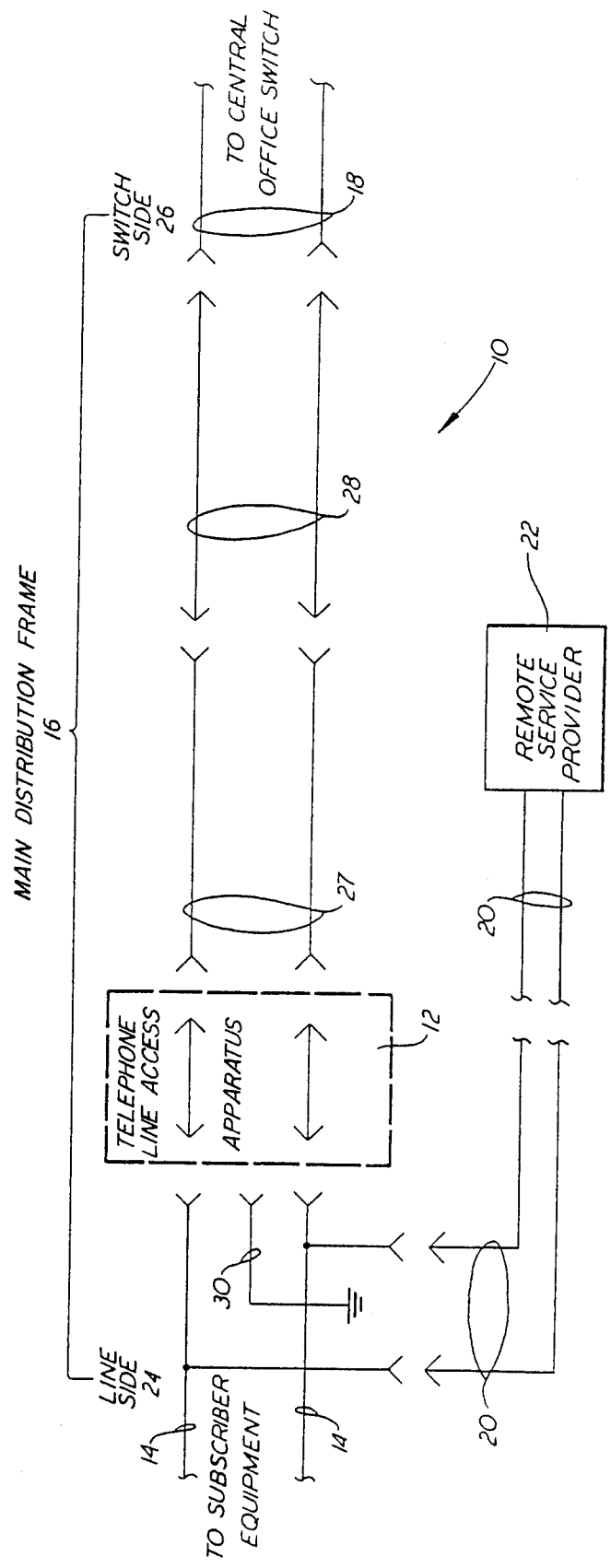
FIG. 1 is a block diagram of a typical environment wherein a telephone line access apparatus, embodying the principals of the present invention, is particularly useful.

A system, generally indicated at 10 in FIG. 1, for providing supplementary services to telephone subscribers is an exemplary environment wherein a telephone line access apparatus, generally indicated at 12 in FIG. 1 and embodying the principals of the present invention, is useful. The typical system 10 includes a plurality of subscriber pairs of wires 14, although only a single pair is shown, connected to a main distribution frame 16 (MDF) of, for example, a telephone company central office switch via the apparatus 12. The main distribution frame 16 is connected to the central office switch by a switch pair of wires 18. The system 10 further includes an auxiliary pair of wires 20 bridging the subscriber pair of wires 14 and connected, for example, to a remotely located secondary service provider 22. Preferably, the main distribution frame 16 includes the telephone line access apparatus 12 serially inserted between the subscriber pair 14 and the line side 24 of the main distribution frame 16. The subscriber pairs of wires 14 are connected to the switch side 26 of the MDF 16 by existing subscriber wires 27 via jumpers 28. Typically, the jumpers 28 connect between the horizontal and vertical segments of the MDF 16. In addition, the main distribution frame 16 includes a station ground 30, also connected to the apparatus 12. It will be clear that main distribution frames or similar junction centers may be privately owned and may, in fact, have various configurations.

Figure 2:
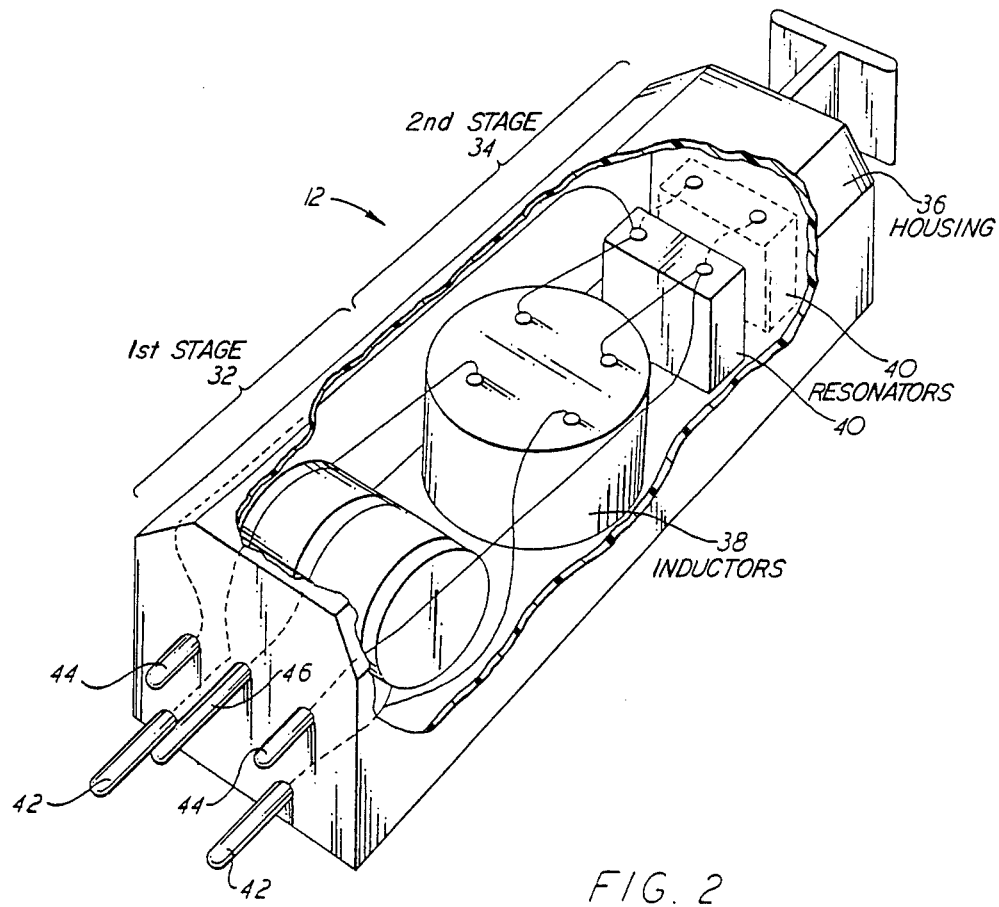
FIG. 2 is a perspective view, not drawn to scale, of a telephone line access apparatus embodying the principals of the present invention.

In one particular embodiment, shown in perspective in FIG. 2, the apparatus 12 includes a first stage 32 that is, essentially, a means for providing high voltage protection and a second stage 34 that, essentially, provides a means for filtering signals from the remote service provider 22 prior to the signals reaching the main distribution frame 16. The apparatus 12, further includes a housing 36 that, as more fully discussed hereinbelow, is adapted to plug into the main distribution frame 16. In one preferred embodiment, the high voltage protector means of the first stage 32 is adapted to protect the central office switch from high voltage transients, such as those resulting from lightning or the accidental crossing of wires. Generally, the first stage 32 includes either high voltage carbon blocks or gas tube protection devices, both types of high voltage protectors are well known in the telephony art. Further, the first stage 32 is connected in parallel across the subscriber pins 42 of the housing 36.

In this particular implementation, the second stage 34 includes a pair of coupled inductors 38 having, preferably, one or more piezoelectric resonators 40 connected in parallel therewith. Although the inductors 38 are preferably coupled, this is not a requirement since individual discrete inductors can also be used. Preferably, the second stage 34 is serially connected to the first stage 32 at the inductor side thereof and to the central office switch pins 44 at the other side thereof. In addition, the first stage 32 includes a station ground wire connected to a grounding 46 pin of housing 36. In an actual implementation, the cross-section of the apparatus 12, perpendicular to the longitudal axis thereof, is preferably identical in size and configuration with the currently used high voltage protectors that are conventionally plugged into any existing main distribution frame 16 of a telephone company central office. However, in order to accommodate the second stage 34 within the same housing 36 as the high voltage means the actual length of the housing 36 may be increased, for example to about two inches long. The configuration of the pins, 42, 44 and 46, i.e. size, length and arrangement, on this one surface is retained to ensure that the main distribution frame 16 does not require any rewiring in order to implement the use of the apparatus 12.

Figure 3:
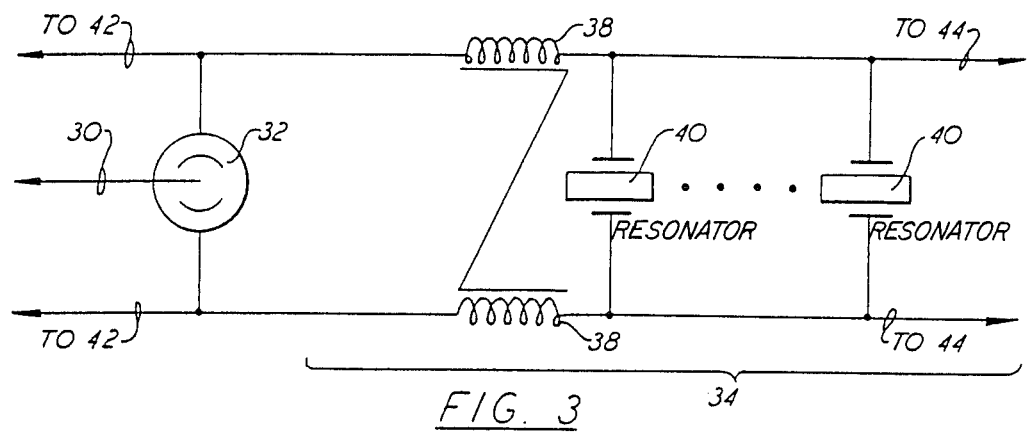
FIG. 3 is a circuit diagram of one embodiment of the apparatus shown in FIG. 2.

In one circuit embodiment, shown in FIG. 3, the first stage 32, i.e., the high voltage protector means, is connected in parallel across the subscriber pair 14 of wires. The high voltage protection means, for example, can be part number 3P-07-P2 available from Shinko Electric Industries, Ltd., Nagano City, 380 Japan. The second stage 34 includes a pair of coupled inductors that may be, for example, about one millihenry and formed, for example, by 79 turns of 33 gauge wire on a 905 PA160 3B7 core available from Ferroxcube of Saugerties, N.Y. In operation, the current therethrough should not exceed about 160 milliamps.

Each resonator 40 is preferably a piezoelectric device connected in parallel across the coupled inductors 38. Preferably, each resonator 40 is designed to resonate at the actual transmission frequency or frequencies used by the secondary service provider 22. Such an arrangement, effectively, provides a notch, or transmission zero, at the frequency whereat information is transmitted by the secondary service provider 22 over the subscriber pairs 14 of wires. Thus, the resultant signal, with respect to the central office, is minimized and well below the required signal strength for frequencies above the voice band. The use of a multiplicity of piezoelectric devices is advantageous in instances wherein the secondary service provider 22 operates at more than a single relatively narrow operating frequency. The use of a multiplicity of piezoelectric devices is also advantageous to provide a broader bandwidth transmission zero. This is achieved by using piezoelectric devices having overlapping bandwidths of different center resonant frequencies. One typical piezoelectric resonator is a BFU 260 K available from Murata-Erie North America, Inc. of Marietta, Ga.

The use of one or more piezoelectric devices in conjunction with coupled inductors is particularly useful in systems such as those discussed and described in U.S. patent application Ser. No. 799,519 entitled "Line Access Apparatus" filed on even date herewith and assigned to the assignee hereof. This application is incorporated herein by reference. In that application, an apparatus is described utilizing a piezoelectric device that primarily serves as a high voltage isolator and frequency coupler for a time-division-multiplexed transmission system operating at frequencies outside of the voice band. In use with such a system the resonator 40 of the apparatus 12 would preferably have the identical resonant frequency as the piezoelectric device used as the high voltage isolator and frequency coupler.

Figure 4:
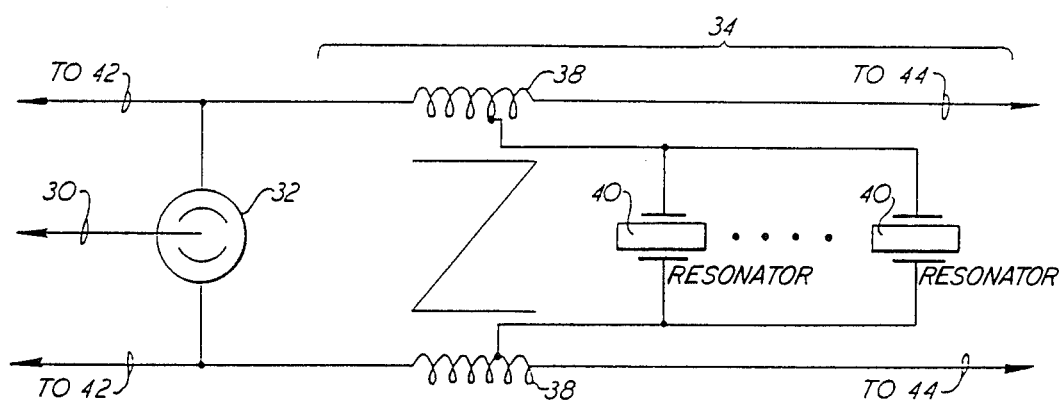
FIG. 4 is a circuit diagram of another embodiment of the apparatus shown in FIG. 2.

A circuit diagram of a second embodiment of the apparatus 12 is shown in FIG. 4. Therein, the reference indicia of elements previously identified and discussed are used to represent the same elements, or the functional equivalents thereof. In the circuit shown in FIG. 4, the basic operation is the same as the circuit shown in FIG. 3 with the notable exception that at least some of the resonators 40 are separately tapped into the coupled inductors 38. This arrangement effectively creates a multi-section filter within the second stage 34 of the apparatus 12 with a similar apparatus used in conjunction with a second subscriber pair of wires. Nevertheless, because of the appropriately selected resonant frequencies of the piezoelectric devices, each resonator 40 provides a transmission zero at the frequency where rejection is required, The transmission frequency being selected based on the frequency utilized by the secondary service provided 22.

One major advantage of the present apparatus 12 is the relatively small size thereof and, consequently, the ability to provide a housing of such a reduced size that the introduction thereof into the subscriber line at the main distribution frame 16 is readily achievable. Further, because of the ability to effect the plug-in into the available positions of an MDF 16, the installation time and effort is greatly reduced. As a result, the provision of secondary services utilizing the existing but previously unavailable larger bandwidth of the subscriber pairs of wires 14 without affecting the voice transmission, due to signal perturbations in the central office switch and the transmission equipment connected thereto, becomes readily available and easily achieved.

Although the present invention has been described herein with respect to exemplary embodiments it will be understood that other arrangements and configurations may also be developed that, nevertheless, do not depart from the spirit and scope of the present invention. Hence, the present invention is deemed limited only by the appended claims and the reasonable interpretation thereof.

What is claimed is:

1. A telephone line access apparatus; said apparatus comprising:
   a first stage, said first stage providing high voltage protection means and being connected across a subscriber pair of wires;
   a second stage, said second stage providing filter means, said first stage and second stage being in series with each other, said second stage including a pair of coupling inductors and a first resonator device, said first resonator device being connected across said coupled inductors; and
   a housing adapted to plug into a main distribution frame, for housing said first and second stages, said housing including a first pair of pins, said first pair of pins having said first stage connected thereacross, said first pair of pins being cooperatively arranged to plug into a main distribution frame, whereby connection is made to a subscriber pair of wires, and a second pair of pins, said second pair of pins having said second stage connected there across, said second pair of pins being cooperatively arranged to plug into a main distribution frame, whereby connection is made to a switch such that said apparatus is in series between said subscriber pair of wires and said switch, whereby a telephone line may be accessed without interfering with the telephone services supported thereby.

2. Apparatus as claimed in claim 1 wherein said housing further comprises:
   a ground pin, said ground pin connecting to said high voltage protector means and being cooperatively arranged to plug into a main distribution frame.

3. Apparatus as claimed in claim 2 wherein said housing further comprises:
   an end surface, said end surface being substantially perpendicular to the longitudinal axis of said housing and includes said first and said second pairs of pins and said ground pins protruding therefrom.

4. Apparatus as claimed in claim 1 wherein said first resonator device includes a piezoelectric device.

5. Apparatus as claimed in claim 1 further comprising:
   a second resonator device having a second resonant frequency connected in parallel with said first resonant device.

6. Apparatus as claimed in claim 5 wherein said first and said second resonator devices have resonant frequencies that are different but having overlapping bandwidths.

7. Apparatus as claimed in claim 5 wherein said first and second resonator devices are piezoelectric devices.

8. Apparatus as claimed in claim 1, wherein the first resonant device is tapped across said coupled inductors.

9. Apparatus as claimed in claim 1 further comprising:
   at least one additional resonator device, said additional resonator devices being connected in parallel with said first resonator device.

10. Apparatus as claimed in claim 9 wherein each said resonator device has a different resonant frequency.

11. Apparatus as claimed in claim 10 wherein one or more of said resonator devices have different resonant frequencies but have overlapping bandwidths.

12. A telephone line access apparatus, comprising:
   a first stage providing high voltage protection means and being connected across a pair of subscriber wires;
   a second stage providing a filter means and being in series with said first stage, said filter means including a pair of coupled inductors being disposed in series with said pair of subscriber wires and a first resonator device connected across said pair of subscriber wires at a position relative to said inductors remote from said first stage; and
   a housing adapted to plug into a main distribution frame, for housing said first and second stages, said housing including a first pair of pins, said first pair of pins having said first stage connected thereacross, said first pair of pins being cooperatively arranged to plug into a main distribution frame, whereby connection is made to a subscriber pair of wires, and a second pair of pins, said second pair of pins having said second stage connected there across, said second pair of pins being cooperatively arranged to plug into a main distribution frame, whereby connection is made to a switch such that said apparatus is in series between said subscriber pair of wires and said switch, whereby a telephone line may be accessed without interfering with the telephone services supported thereby.

13. A telephone line access apparatus, as described in claim 12, wherein said first resonator device has first and second ends, each end being tapped to one of said coupled inductors.

14. A telephone line access apparatus, as described in claim 13 having an additional resonator device connected in parallel with said first resonator device, said resonator devices having different resonant frequencies.

* * * * *